US006267470B1

(12) United States Patent
Watanabe

(10) Patent No.: US 6,267,470 B1
(45) **Date of Patent: *Jul. 31, 2001**

(54) INK JET HEAD STRUCTURE HAVING MOS TRANSISTORS FOR POWER SUPPLY, AND HEAD SUBSTRATE, INK JET CARTRIDGE, AND INK JET APPARATUS HAVING THE SAME

(75) Inventor: Hidenori Watanabe, Zama (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/780,607

(22) Filed: Jan. 8, 1997

(30) Foreign Application Priority Data

Jan. 11, 1996 (JP) ........................................ 8-002713
Dec. 27, 1996 (JP) ........................................ 8-349529

(51) Int. Cl.[7] ........................ B41J 2/05; H01L 29/76
(52) U.S. Cl. ........................ 347/59; 257/336
(58) Field of Search ........................ 347/59, 58, 57, 347/56, 209, 210; 257/361, 366, 356, 357

(56) References Cited

U.S. PATENT DOCUMENTS 4,939,571 * 7/1990 Nishizawa et al. .................. 257/408
4,947,192 8/1990 Hawkins et al. .................. 346/140 R
5,159,353 * 10/1992 Fasen et al. .................. 347/59
5,371,395 * 12/1994 Hawkins .................. 257/361
5,514,989 5/1996 Sato et al. .................. 327/109
5,517,224 * 5/1996 Kaizu et al. .................. 347/59

FOREIGN PATENT DOCUMENTS 0 294 868 12/1988 (EP) .
0 481 153 4/1992 (EP) .
0 563 504 10/1993 (EP) .
0 566 262 10/1993 (EP) .
0 569 219 11/1993 (EP) .
0 574 911 12/1993 (EP) .
6302363 * 1/1988 (JP) .
1235369 * 9/1989 (JP) .
7-195694 8/1995 (JP) .

* cited by examiner

*Primary Examiner*—Judy Nguyen
(74) *Attorney, Agent, or Firm*—Fitzpatrick, Cella, Harper & Scinto

(57) ABSTRACT

An ink jet head is provided with heaters to generate energy to be utilized for discharging ink, and MOS transistors to supply electric power to the heaters for recording by discharging ink. For this ink jet head, the MOS transistors comprise source regions and drain regions formed by doping layers arranged near the surface of a semiconductor substrate, gates formed on the semiconductor substrate through an oxide film and arranged to cross over the source regions and the drain regions, and contact units formed by a doping layer different from that of the source regions, and arranged near the surface within the source regions in order to draw out electrons or holes to be unintentionally generated on the semiconductor substrate. With the structure thus arranged, the potential difference becomes smaller between the source regions and back gate area on the semiconductor substrate, making it possible to prevent heaters from being destroyed by any excessive current that may flow uncontrollably.

13 Claims, 9 Drawing Sheets

FIG. 2 - PRIOR ART
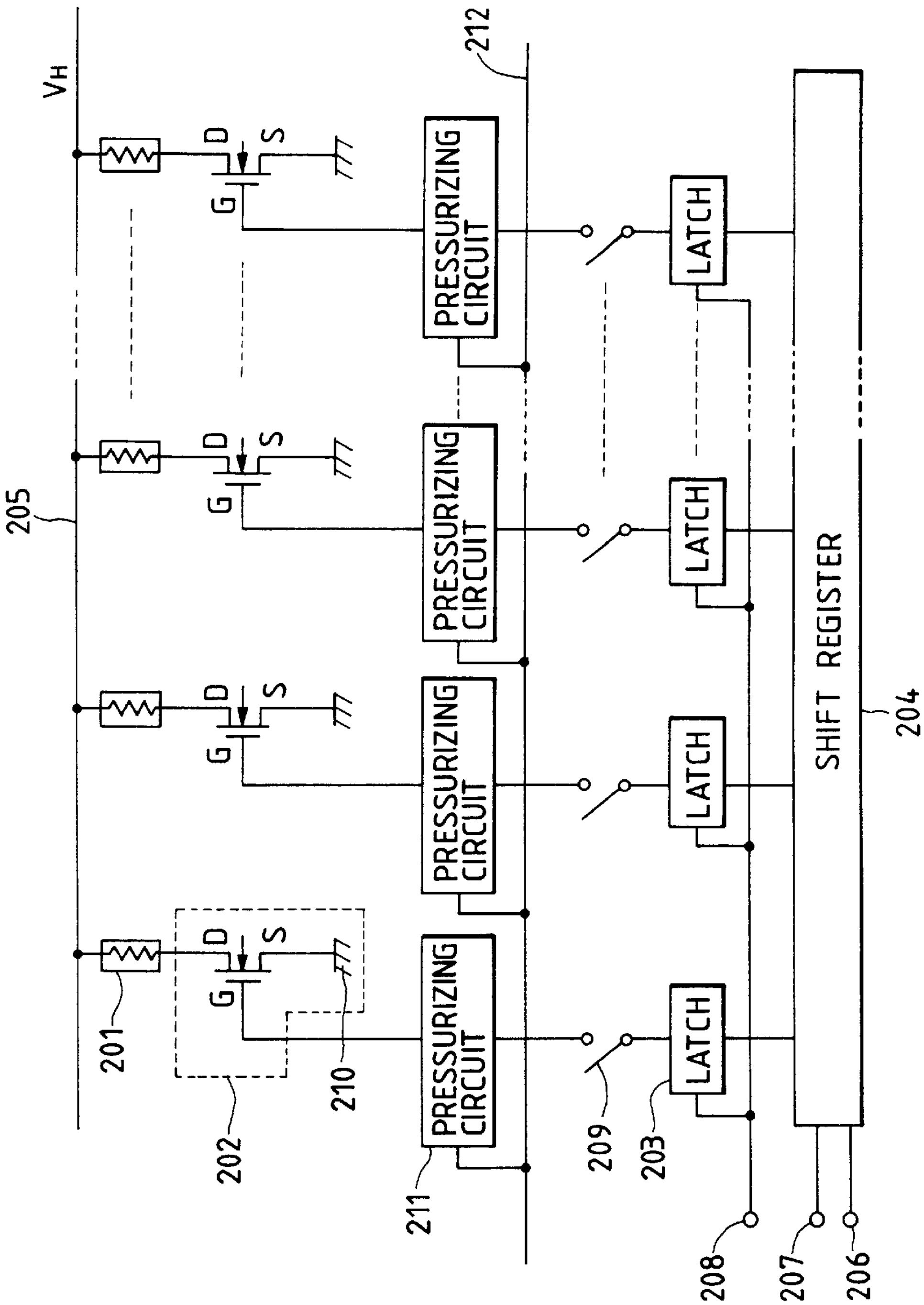

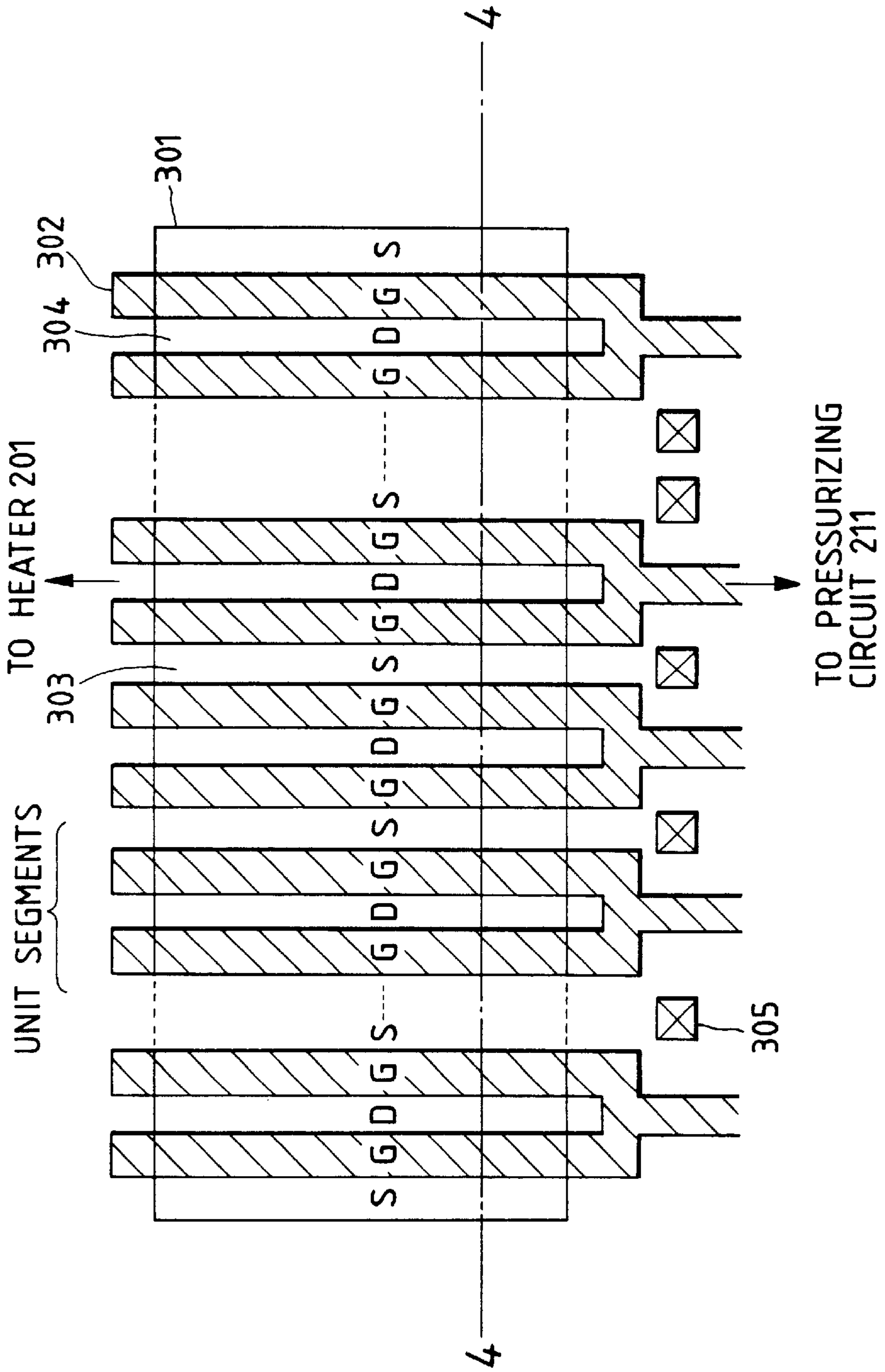
FIG. 3 - PRIOR ART

FIG. 4 - PRIOR ART
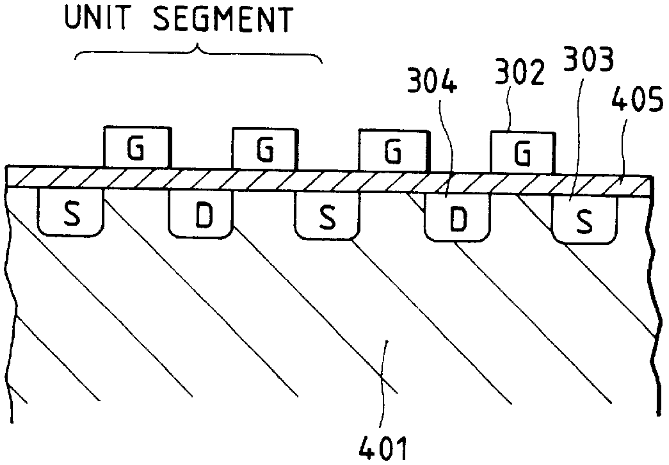
FIG. 5 - PRIOR ART
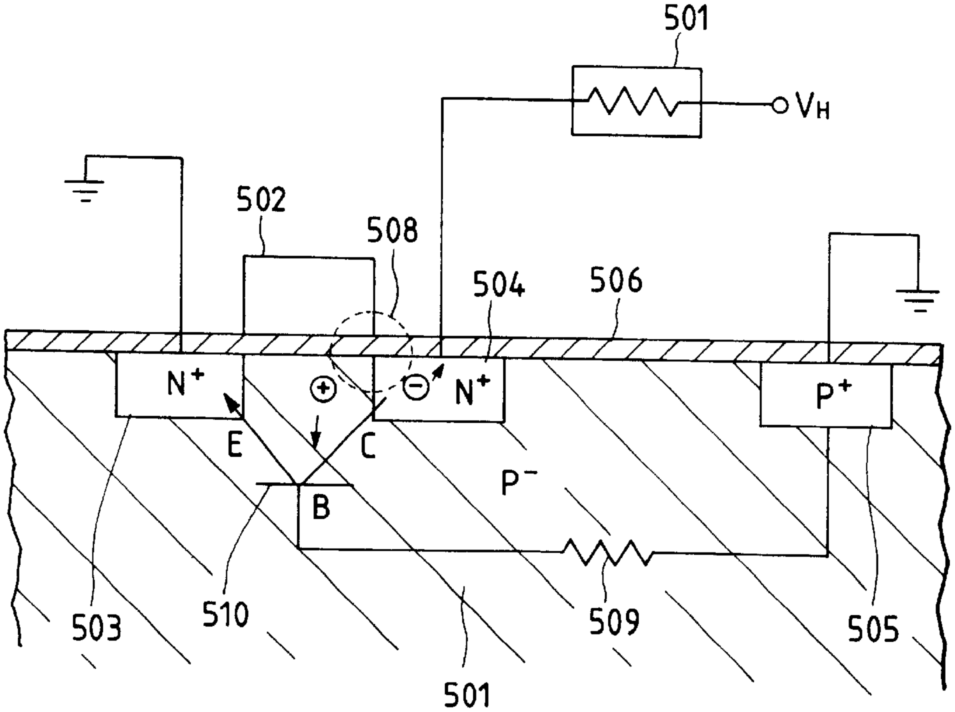

FIG. 6A - PRIOR ART
INPUT SIGNAL
FIG. 6B - PRIOR ART
ELECTRICAL CURRENT OF HEATER
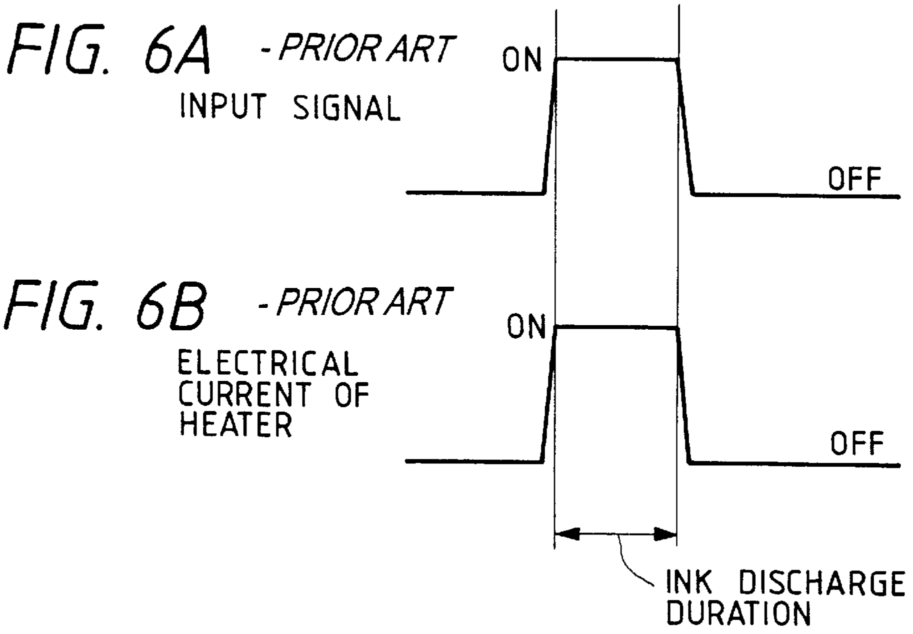
FIG. 7A - PRIOR ART
INPUT SIGNAL
FIG. 7B - PRIOR ART
ELECTRICAL CURRENT OF HEATER
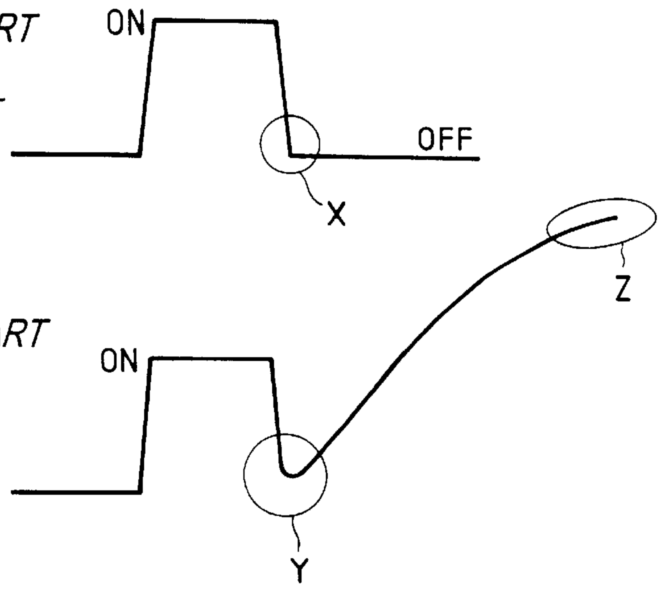

INK JET HEAD STRUCTURE HAVING MOS TRANSISTORS FOR POWER SUPPLY, AND HEAD SUBSTRATE, INK JET CARTRIDGE, AND INK JET APPARATUS HAVING THE SAME

BACKGROUND OF THE INVENTION

1. Field of the Invention

The present invention relates to an ink jet head used for an ink jet recording apparatus for recording on a recording medium by discharging ink, which is provided with heaters that generate energy utilized for discharging ink, and MOS transistors that supply electric power to the heaters. The invention also relates to a head substrate, an ink jet cartridge, and an ink jet apparatus.

2. Related Background Art

The ink jet head, which is mounted on an ink jet recording apparatus, is provided with a plurality of discharge ports to discharge ink, a common liquid chamber to provisionally retain ink to be supplied to each of the discharge ports, and ink paths that connect the common liquid chamber and each of the discharge ports. In each of the ink paths, a heater (electrothermal transducing element) is formed to generate energy utilized for discharging ink. The heaters are arranged on a substrate made of silicon or the like, and formed on the substrate with the MOS transistors that serves as driving elements to supply electric power to the heaters together with wiring and others. With a structure of the kind, the ink, which has been supplied to the common liquid chamber, is induced into each of the ink paths and held in it by the meniscus formed at each of the discharge ports when recording is executed. At this juncture, the heaters are selectively driven to create film boiling and generate air bubbles in the respective ink paths. With the development of such air bubbles, ink is discharged from the discharge ports, respectively.

FIG. 2 shows the example of such heater driving circuit. FIG. 2 is a block diagram which illustrates the structure of a heater driving circuit for the conventional ink jet head.

In FIG. 2, one end of a heater 201 that generates energy for discharging ink is connected to a first power source line 205 that serves as the supply source of a given electric power for each of the heaters 201. The other end of the heater 201 is connected to the drain (D) of a MOS transistor 202 that controls the electric power to be supplied to the heater. The source (S) of the MOS transistor is connected to the ground potential 210, and a pressurizing circuit 211 is connected to a gate (G) to which voltages are applied to control the on and off of the MOS transistor. The pressurizing circuit 211 pressurizes and outputs the voltage that has been output from the latch circuit 203, which will be described later, so as to apply a voltage that makes the on-resistance of the MOS transistor small enough. Also, to the pressurizing circuit 211, an electric power is supplied from a second power source line 212.

A shift register 204 is a circuit to provisionally hold image data for recording by supplying electric power to each of the heaters 201. On the input terminal 207 for a transmission clock, the transmitting clock (CLK) is inputted. To the image data input terminal 206, image data (DATA) are inputted in the form of serial data, and transferred to the shift register 204.

The outputs of the shift register 204 are connected to the latch circuits corresponding to the heaters 201, respectively. Each of the latch circuits 203 is to store and hold image data per corresponding heater 201, and latches image data in accordance with the timing signal (LT) to be inputted from the latch signal input terminal 208. Also, the pressurizing circuits 211 are connected to each output of the latch circuits 203 through switches 209, respectively. The input and cut off of signals are controlled by the on and off of the respective switches 209.

These image data (DATA), transmission clocks (CLK), and timing signals (LT) are transmitted from a control board (not shown) provided for an ink jet recording apparatus.

Now, with reference to FIGS. 3, 4 and 5, the description will be made of the elemental structure of a MOS transistor 202 that controls the supply of electric power to a heater 201.

FIG. 3 is a plan view which shows the layout structure of the MOS transistor represented in FIG. 2. FIG. 4 is a cross-sectional view of the MOS transistor, taken along line 4—4 in FIG. 3. Also, FIG. 5 is a structurally sectional view which shows a parasitic transistor unintentionally formed on the MOS transistor represented in FIG. 3. In this respect, FIG. 5 is a cross-sectional view which represents an example in which an N-channel MOS transistor is shown. In FIG. 3, the active area 301 is a semiconductor substrate where MOS transistors 202 are formed corresponding to each of the heaters 201. On this area, the doping layers that become the source region (S) 303 and the drain region (D) 304, respectively, are alternately formed with an electrode made of polysilicon or the like that becomes the gate (G) 302 being arranged between each of source and drain regions. As shown in FIG. 3, the MOS transistor 202 is structured by the unit segments comprising two gates 302, two source regions 303 and one drain region 304 in order to enhance the current supply capability thereof with respect to the heater 201. However, the source region 303 is shared by the adjacent unit segments for use, respectively.

Also, outside the active area 301, each contact unit 305 is arranged to fix the potential of the back gate area.

As shown in FIG. 4, an oxide film 405 is formed to be an insulation layer on the surface of the active area 301 that serves as the semiconductor substrate for each of the MOS transistors 202. On the oxide film 405, each electrode is formed to be a gate 302. The source region 303 and drain region 304 that form the respective doping layers are arranged near the surface of the active area with the oxide film 405 between them, and are externally and electrically connected by means of electrodes (not shown). Here, the area where the source region 303 and drain region 304 are not provided becomes the back gate area 401.

In FIG. 5, on the back gate area 501 that serves as a p-type semiconductor substrate, an oxide film 506 is formed to be an insulation layer. On the oxide film 506, each of the gates 502 is arranged by an electrode formed by polysilicon or the like. Near the surface of the back gate area 501, there are arranged the source region 503 and drain region 504 formed by $N^+$-type semiconductor, and the contact unit 505 formed by $P^+$-type that serves as an lead-out electrode from the back gate area, with the oxide film being placed between them.

The drain region 504 is connected to a first power source line thorough a heater 511. A power source voltage $V_H$ is applied to it. Also, both the source region 503 and the contact unit 505 are connected to the ground potential.

Now, on the back gate area 501 described above, a parasitic transistor 510 (lateral NPN bipolar transistor) is equivalently formed unintentionally, having the source region 503 as its emitter E; the back gate area 501 as its base B, and the drain region 504 as its collector C, respectively.

Each contact unit 505 is arranged to fix the potential of the back gate area 401, and by applying a given voltage to the contact unit 505, it becomes possible to stably fix the threshold voltage $V_{th}$ at a desired level to switch on the MOS transistor 202. Here, in this respect, the contact unit 505 is connected to the ground potential.

For an ink jet head mounted on an ink jet recording apparatus, it is desirable to make a smaller semiconductor chip capable of giving a larger electric power to each of the heaters. To this end, the layout structure of the MOS transistor 202 is such that as shown in FIG. 3, the gate 302, the source region 303, and the drain region 304 are formed in a strip configuration on the active area 301 in order to enhance the current supply capability of each MOS transistor. Consequently, the conventional contact units 305 are arranged in locations outside the active area 301.

When the MOS transistors are operated for an ink jet head described above, the higher a voltage that is applied to the drain, that is, the higher the power source voltage $V_H$, the larger is the electric power to be supplied to each of the heaters. Therefore, it is made possible to obtain a better ink jet head.

However, if the power source voltage is made higher, the parasitic transistors operate with the MOS transistors at the same time. As a result, a problem is encountered that an excessive current flows uncontrollably between the source and drain, and causes a heater to be destroyed.

This is due to the fact that if an operation is executed with the application of a high power source voltage to the drain, an impact ionization takes place at the junction between the drain and the back gate area as shown in FIG. 5, and an unintentional pair of electron and hole are generated. The electron thus generated is drawn out from a drain electrode (not shown), and the hole is drawn out from a contact electrode (not shown) by way of the back gate area. At this juncture, a potential difference occurs between the source and the back gate area due to resistance between the back gate area and the contact unit. Then, between the emitter and base of the parasitic transistor, a forward bias is applied. Thus, the parasitic transistor operates to allow a large current to flow after all.

Particularly, in accordance with the conventional structure of a MOS transistor, the contact units are arranged apart from the source and drain regions of the MOS transistor. As a result, the resistive value between the back gate area and each contact unit becomes larger, which facilitates the parasitic transistor to operate.

Now, the description will be made of the drawback that may take place if the parasitic transistors operate as described above.

FIGS. 6A and 6B illustrate the input signal and heater current in a normal operation, respectively. When the switch 209 shown in FIG. 2 is turned on, the data held in the latch circuit for driving a heater is transferred to the pressurizing circuit with respect to the bit from which current flows to the heater. Then, the MOS transistor 202 is turned on to enable current to flow to the heater. At this juncture, as shown in FIGS. 6A and 6B, the relationship between the input signal to the switch 209 and the current flowing to the heater 201 is such that the current flows to the heater 201 only during the period in which the signal is inputted into the switch 209.

As described above, the parasitic transistor is caused to operate by the generation of an electron and hole pair unintentionally brought about by the impact ionization. The impact ionization takes place most intensely in condition that a high voltage is applied to the drain, while a low voltage of approximately 1 to 2 V is being applied to the gate. In FIG. 7A, a reference mark X designates a biased condition where the impact ionization becomes most intense.

Therefore, the parasitic transistor operates most easily when the MOS transistor changes its status from on to off. In this case, the relationship between the input signal to the switch 209 and the current flowing to the heater 20 is as shown in FIGS. 7A and 7B.

As shown in FIG. 7B, when the parasitic transistor operates at a reference mark Y, an excessive current flows uncontrollably after the input switch is turned off, and in the worst case, the destruction of a heater is caused as indicated by a reference mark Z.

SUMMARY OF THE INVENTION

The present invention is designed in consideration of the drawback encountered in the conventional techniques as described above. It is an object of the invention to provide an ink jet head and a head substrate provided with MOS transistors that do not allow any unintentional parasitic transistors to operate and result in the heater destruction that may cause the ink jet head to malfunction or an unfavorable load to be exerted, and also, to provide an ink jet cartridge and an ink jet apparatus.

It is another object of the invention to provide an ink jet head having heaters to generate energy to be utilized for discharging ink, and MOS transistors to supply electric power to the heaters for recording by discharging ink, in which the MOS transistors comprise:

source regions and drain regions formed by doping layers arranged near the surface of a semiconductor substrate;

gates formed on the semiconductor substrate through an oxide film and arranged to cross over the source regions and the drain regions; and contact units formed by a doping layer different from that of the source regions, and arranged near the surface within the source regions in order to draw out electrons or holes to be unintentionally generated on the semiconductor substrate.

In this respect, the source regions and the contact units may be connected to the same potential.

It is still another object of the invention to provide a substrate for use of an ink jet head having heaters to generate energy to be utilized for discharging ink, and MOS transistors to supply electric power to the heaters for recording by discharging ink, in which the MOS transistors comprise:

source regions and drain regions formed by doping layers arranged near the surface of a semiconductor substrate;

gates formed on the semiconductor substrate through an oxide film and arranged to cross over the source regions and the drain regions; and contact units formed by a doping layer different from that of the source regions, and arranged near the surface within the source regions in order to draw out electrons or holes to be unintentionally generated on the semiconductor substrate.

It is a further object of the invention to provide an ink jet cartridge formed by an ink jet head having heaters to generate energy to be utilized for discharging ink, and MOS transistors to supply electric power to the heaters for recording by discharging ink, and also, by an ink retainer to retain ink to be supplied to the head, in which the MOS transistors comprise:

source regions and drain regions formed by doping layers arranged near the surface of a semiconductor substrate;

gates formed on the semiconductor substrate through an oxide film and arranged to cross over the source regions and the drain regions; and contact units formed by a doping layer different from that of the source regions, and arranged near the surface within the source regions in order to draw out electrons or holes to be unintentionally generated on the semiconductor substrate.

It is still a further object of the invention to provide an ink jet apparatus provided with an ink jet head having heaters to generate energy to be utilized for discharging ink, and MOS transistors to supply electric power to the heaters for recording by discharging ink, and also, with a mounting unit to mount the head, in which the MOS transistors comprise:

source regions and drain regions formed by doping layers arranged near the surface of a semiconductor substrate;

gates formed on the semiconductor substrate through an oxide film and arranged to cross over the source regions and the drain regions; and contact units formed by a doping layer different from that of the source regions, and arranged near the surface within the source regions in order to draw out electrons or holes to be unintentionally generated on the semiconductor substrate.

For the ink jet head structured as described above, each contact unit of the MOS transistors is arranged within each source region. Therefore, electrons or holes unintentionally generated on the semiconductor substrate are drawn out from each of the locations near the places where these are generated. Therefore, the potential difference generated between the source regions and the back gate area on a semiconductor substrate becomes smaller, making it possible to suppress the operation of each parasitic transistor.

BRIEF DESCRIPTION OF THE DRAWINGS

FIG. 2 is a block diagram which shows the structure of a heater driving circuit for the conventional ink jet head.

FIG. 3 is a plan view which shows the layout structure of the MOS transistor represented in FIG. 2.

FIG. 4 is a cross-sectional view of the MOS transistor, taken along line 4—4 in FIG. 3.

FIG. 5 is a cross-sectional view which shows the structure illustrating a parasitic transistor formed unintentionally on the MOS transistor represented in FIG. 3.

FIG. 6A is a view which shows an input signal in an normal operation, and

FIG. 6B is a view which shows a heater current in the normal operation.

FIG. 7A is a view which shows an input signal when a parasitic transistor operates, and FIG. 7B is a view which shows a heater current when a parasitic transistor operates.

DETAILED DESCRIPTION OF THE PREFERRED EMBODIMENTS

Hereinafter, with reference to the accompanying drawings, the present invention will be described.

The MOS transistors provided for the ink jet head of the present invention are used as elements to supply electric power to the heaters of the ink jet head as in the prior art. Only the structure thereof is different from that of the prior art. In the description given below, therefore, the structure of the MOS transistor used for the ink jet head of the present invention will be described. However, the descriptions of the ink jet head and the heater driving circuit will be omitted.

Figure 1:
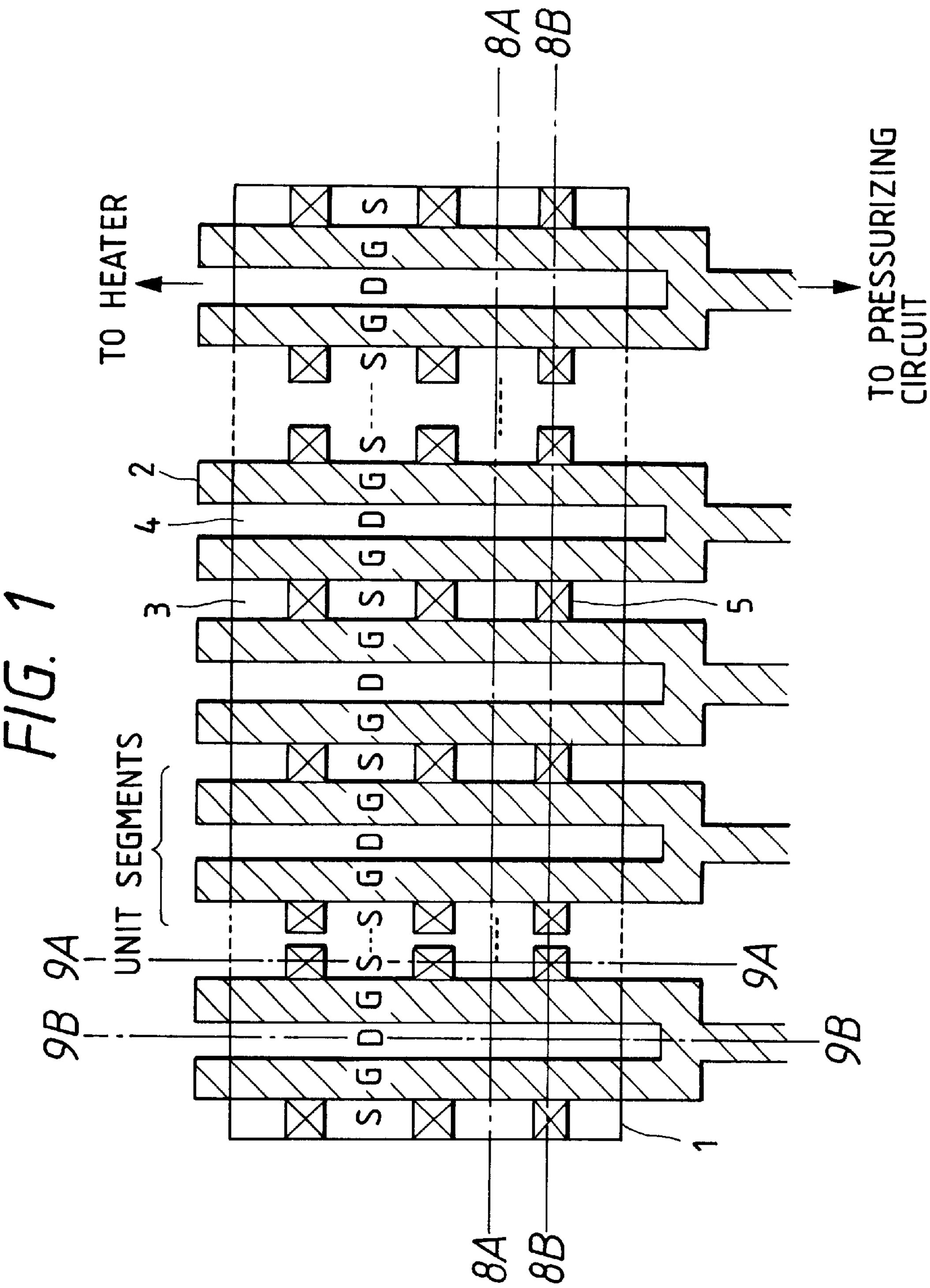
FIG. 1 is a plan view which shows the layout structure of a MOS transistor used for an ink jet in accordance with the present invention.

FIG. 1 is a plan view which shows the layout structure of a MOS transistor used for an ink jet head of the present invention. In FIG. 1, the active area 1 is a semiconductor area on which MOS transistors are formed corresponding to heaters, respectively. Doping layers that become the source regions 3 (S) and the drain regions 4 (D) are formed alternately with each of the electrodes becoming the gates 2 (G), which are arranged between them. As shown in FIG. 1, the MOS transistor comprises each of the unit segments having two gates 2, two source regions 3, and one drain region 4 in order to enhance the current supply capability thereof with respect to a heater. However, each source region 3 is shared for use by each of the adjacent unit segments, respectively.

Also, for each source region 3, contact units 5 are formed to draw out electrons or holes generated in the back gate area.

Figure 8A:
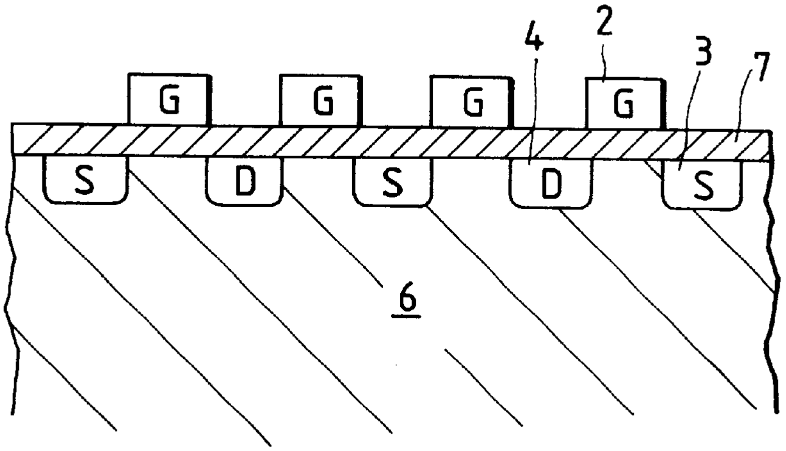
FIG. 8A is a cross-sectional view schematically showing the structure of the MOS transistor, taken along line 8A—8A in FIG. 1.
Figure 8B:
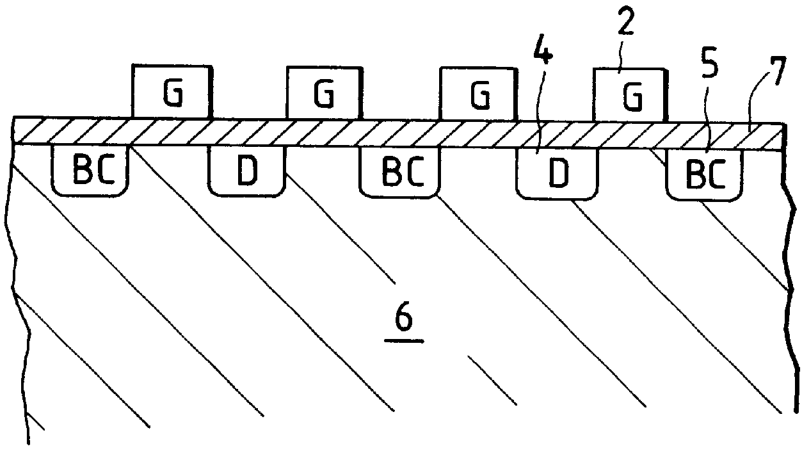
FIG. 8B is a cross-sectional view schematically showing the structure of the MOS transistor, taken along line 8B—8B in FIG. 1.

FIG. 8A is a cross-sectional view which shows the MOS transistor represented in FIG. 1, taken along line 8A—8A in it. FIG. 8B is a cross-sectional view which shows the MOS transistor represented in FIG. 1, taken along line 8B—8B. In FIGS. 8A and 8B, the same parts that appear in FIG. 1 are designated by the same reference numerals.

FIG. 8A is a cross-sectional view taken along line 8A—8A in FIG. 1, which illustrates the same structure as shown in FIG. 4 that represents the prior art.

FIG. 8B is a cross-sectional view taken along line 8B—8B in FIG. 1 representing the structure in which the source regions 3 represented in FIG. 8A are replaced by the contact units 5 (designated by a reference mark BC in FIG. 8B) for drawing out electrons or holes generated in the back gate area.

Figure 9A:
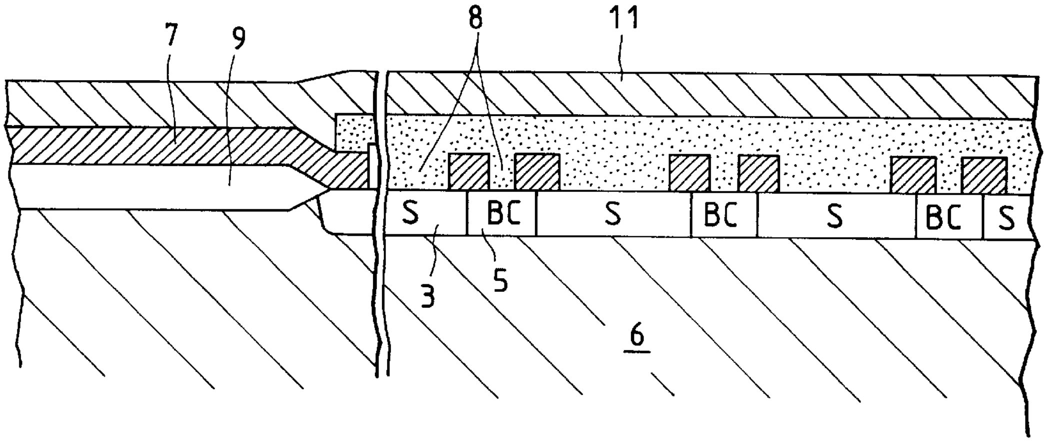
FIG. 9A is a cross-sectional view schematically showing the structure of the MOS transistor, taken along line 9A—9A in FIG. 1.

FIG. 9A is a cross-sectional view taken along line 9A—9A shown in FIG. 1. The contact units 5 on the back gate area described above are formed on the source regions in an arbitrary rate as shown in FIG. 9A. For example, in case of an N-channel MOS transistor, p-type contact regions 5 in which boron or some other impurity is doped are formed in arbitrary locations within the N-type source region having As (arsenic), P (phosphorus) or some other impurity doped in it, which is formed on the p-type back gate area 6 having B (boron) or some other impurity doped in it.

These source regions 3 and contact regions 5 are connected to the first Al wiring through the contact holes 8.

In FIG. 9A, a reference numeral 7 designates an oxide film area formed by means of CVD using PSG, BPSG, or the like; 9, a LOCOS area; and 11, an interlayer film formed by means of CVD using SiO, SiN, or the like.

Figure 9B:
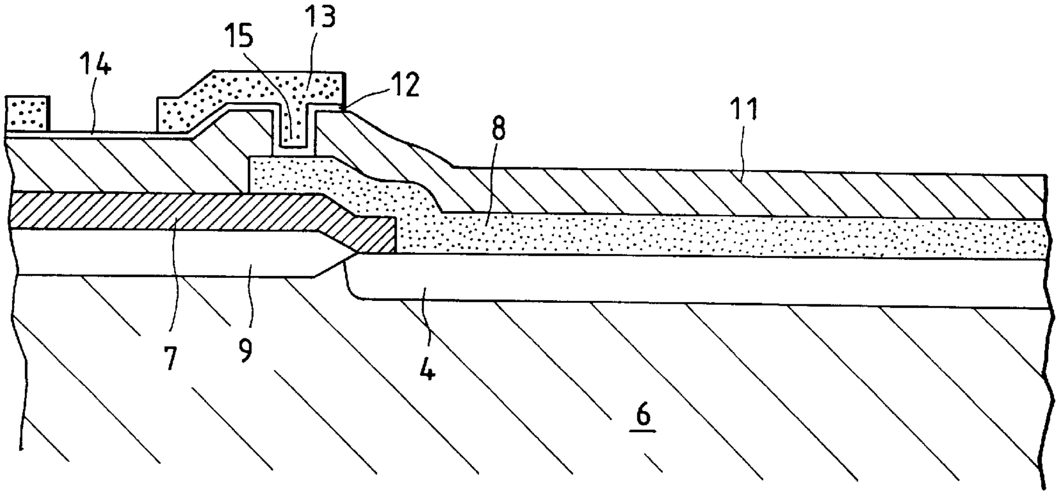
FIG. 9B is a cross-sectional view schematically showing the structure of the MOS transistor, taken along line 9B—9B in FIG. 1.

FIG. 9B is a cross-sectional view taken along line 9B—9B in FIG. 1. Here, to describe a case of an N-channel transistor, there are formed N-type drain regions 4, in which As (arsenic), P (phosphorus), or some other impurity is doped, within in the p-type back gate area 6. The drain regions 4 are connected to the first Al wiring through the contact holes 8, and further, by way of through holes 15, these are connected to a heater layer formed by TaN, and to the laminated wiring of a second Al wiring 13 as well.

The heater area 14 is formed by removing only the Al layer on desired areas of the heater layer 12 and the second Al wiring 13 as well. In this way, only the heater layer is left intact.

With the structure arranged as above, the impact ionization takes place at the junction between the drain region 4 and the back gate area (see FIGS. 8A and 8B) if the power source voltage applied to the drain region 4 is high as described above, and then, a pair of electron and hole are generated.

As shown in FIG. 1, FIGS. 8A and 8B, if the contact units 5 are arranged on a part of each source region 3, the electrons or holes thus generated are drawn out in the locations near the places where these are generated. As a result, the resistive value between the parasitic transistor unintentionally formed in the back gate area and each contact unit becomes smaller, and the potential difference between them becomes also smaller, thus suppressing the operation of each parasitic transistor.

At this juncture, the larger the ratio of the area of the contact unit 5 to the area of the source region 3, the greater is the suppressing effect on the operation of a parasitic transistor. However, the area of the source region 3 is inevitably curtailed, leading to the creation of a problem that the current supplying capability is lowered with respect to a heater, which presents itself as a load to the MOS transistor.

Therefore, it is necessary to structure a MOS transistor so that no parasitic transistor is easily operative, while the reduction of current supplying capability is made smaller.

In accordance with the experiments carried out by the applicant hereof, it is possible to raise the voltage, at which a parasitic transistor begins to operate, from 30 V that can be set by use of the conventional structure, to approximately 38 V by use of the structure of the present embodiment by arranging approximately 10 contact units 5 whose one side is each 10 $\mu$m against a MOS transistor whose gate width is 1,000 $\mu$m. Here, it is also possible to keep the reduction of the driving power approximately by 3%.

Consequently, the unintentional operation of parasitic transistors can be suppressed by arranging on a part of each source region 3 the contact units that draw out electrons or holes generated on the back gate area. Hence, the heaters are prevented from being destroyed by the load that may be caused by the operation of any of the parasitic transistors.

Figure 10:
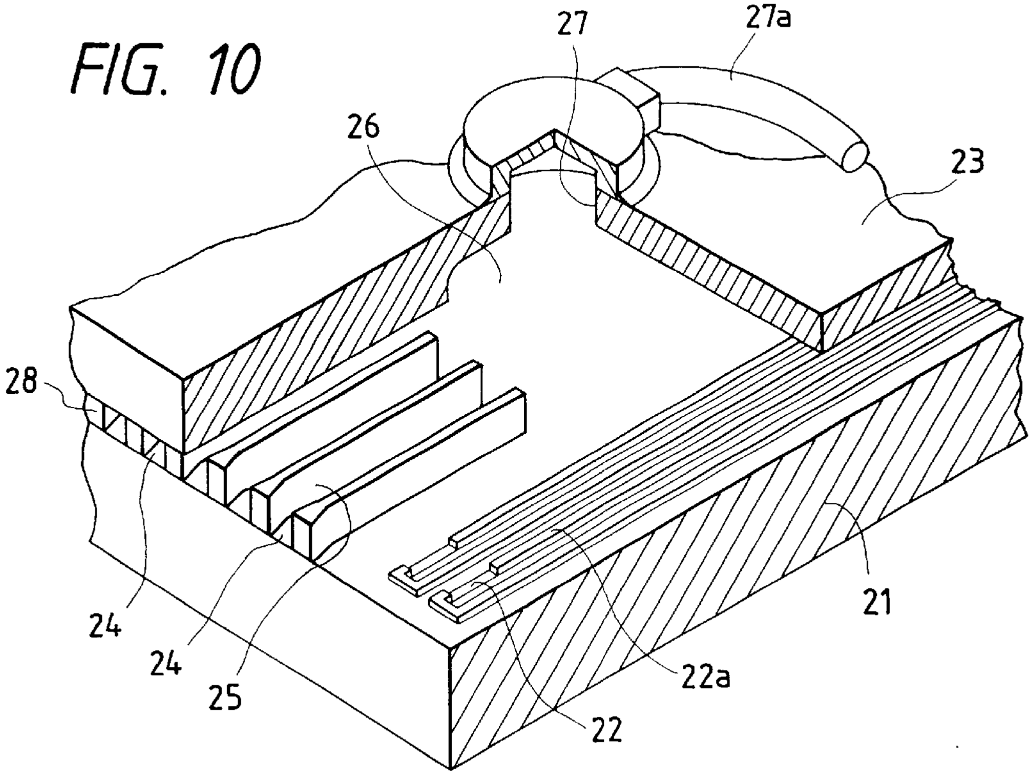
FIG. 10 is a partially broken perspective view which schematically shows an ink jet head in accordance with one embodiment of the present invention.

FIG. 10 is a view which shows a liquid jet recording head in accordance with one embodiment of the present invention. This head comprises a base board 21 having discharge energy generating elements 22 arranged on it; a ceiling plate 23 that forms liquid paths 25 conductively connected to orifices (discharge ports) 24, a liquid chamber 26; and passage wall members 28 nipped between the ceiling plate and the base board to form the liquid paths corresponding to the energy generating elements 22, respectively. The base board 21 is produced by forming the discharge energy generating elements 22 of tantalum nitride or the like and pairs of aluminum electrodes 22*a* by the known means of photolithography on a silicon substrate. On the surface thereof, an electric insulation layer of $SiO_2$, SiC, $Si_3N_4$, or the like is formed, which is covered by a protection layer formed by a Ta film or the like to prevent damages (such as cavitation erosion) from being caused to the discharge energy generating elements due to mechanical shocks when recording liquid is discharged. Also, for the ceiling plate 23, a supply inlet 27 is arranged to supply ink or other recording liquid to the liquid chamber 26.

Figure 11:
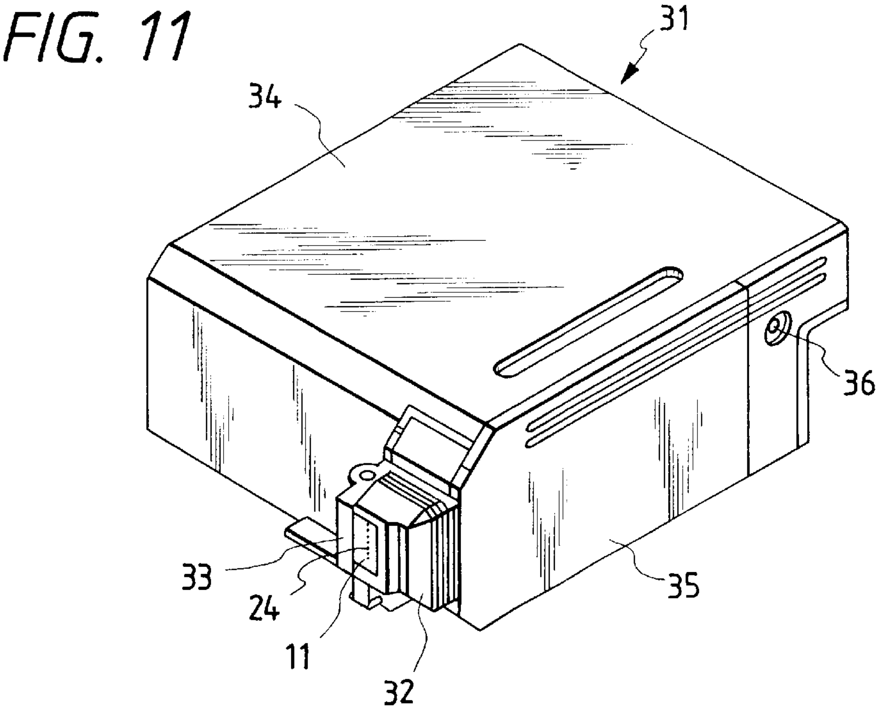
FIG. 11 is a perspective view which schematically shows an ink jet cartridge in accordance with one embodiment of the present invention.

FIG. 11 is a perspective view which schematically shows the external appearance of an ink jet cartridge in accordance with one embodiment of the present invention.

The ink jet cartridge 31 of the present embodiment is mounted on the carriage for an ink jet apparatus (not shown) in a state of being positioned on it, and arranged to be able to transmit and receive electric signals to and from the ink jet apparatus. The main part of the ink jet cartridge 31, which is detachably mounted on the carriage, comprises an ink jet head 11; a head holder 32 to hold this ink jet head 11; a pressure block 33 to press the ink jet head 11 to the head holder 32; an ink tank 34 to retain ink; and a cover 35 to airtightly close the interior of the ink tank 34. For the ink tank 34, which occupies a major portion of the ink jet cartridge 31, an air conduit port 36 is formed to maintain the atmospheric pressure in the ink tank 34.

The ink jet head 11 having a plurality of ink discharge ports 24 formed for it to discharge ink is structured in such a manner as to correspond to the embodiment described earlier. This ink jet head 11 is pressed to the head holder 32 by means of the pressure block 33. Ink is supplied to the common ink chamber 26 and each of the ink paths 25 from the ink tank 34 through the ink supply tube 27*a* and the supply inlet 27 arranged for the ink jet head 11 (see FIG. 10).

The ink jet cartridge 31 of the present embodiment is formed integrally with the ink jet head 11 and the ink tank 34, but it may be possible to adopt an ink jet cartridge of such a structure that the ink tank 34 side is exchangeably coupled to the ink jet head 11.

Figure 12:
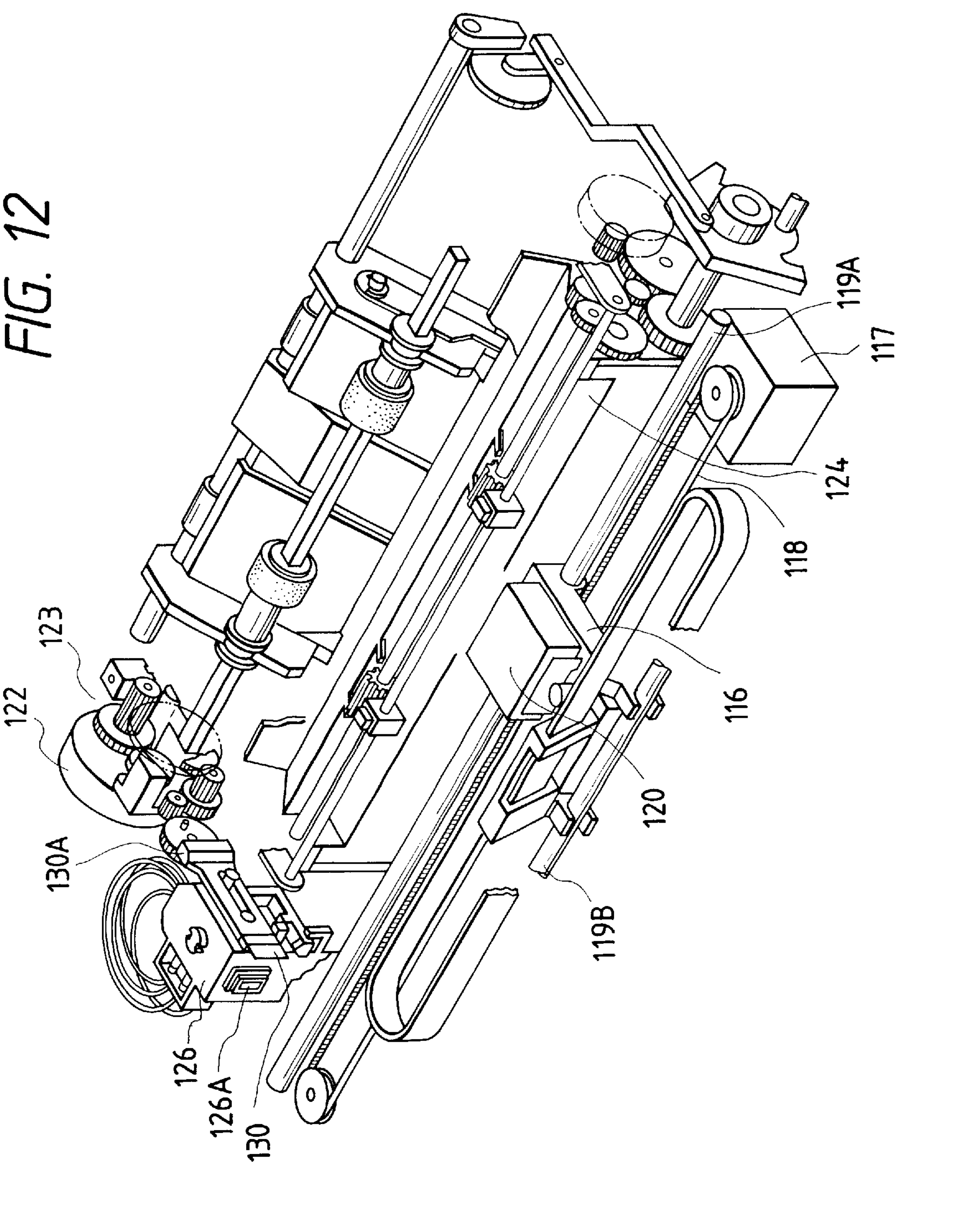
FIG. 12 is a perspective view which schematically shows the principal part of an ink jet apparatus in accordance with one embodiment of the present invention.

FIG. 12 is a perspective view which schematically shows the external appearance of one example of the principal part of an ink jet recording apparatus (IJRA) provided with a recording head obtainable by the present invention, which is mounted as an ink jet head cartridge.

In FIG. 12, a reference numeral 120 designates an ink jet head cartridge (IJC) provided with a nozzle group to discharge ink to the recording surface of a recording sheet, which is carried onto a platen 124; 116, a carriage HC to hold the IJC 120, which is coupled to a part of a driving belt 118 to transmit the driving power of a driving motor 117, and which is made slidable on the two guide shafts 119A and 119B arranged in parallel to each other, thus making it possible to cause the IJC 120 to reciprocate on the entire width of the recording sheet.

A reference numeral 126 designates a head recovery device, which is arranged on one end of the traveling path of the IJC 120, such as a location facing the home position thereof. The head recovery device is operated by the driving power of a motor 122 through a power transmission mechanism 123 to execute capping for the IJC 120. Interlocked with the capping of the IJC by means of the capping unit 126A of the head recovery device 126, ink is sucked by an appropriate suction means arranged in the head recovery device 126 or ink is pressurized to flow by an appropriate pressurizing means arranged on the ink supply passage that leads to the IJC 120, thus discharging ink compulsorily from the discharge ports to execute a discharge recovery process such as removing overly viscous ink in the nozzles. Also, with the execution of capping, it is possible to protect the IJC when recording is at rest.

A reference numeral 130 designates a blade formed by silicon rubber to serve as a wiping member, which is arranged on the side face of the head recovery device 126. The blade 130 is held by a blade holding member 130A in a cantilever fashion, and driven by the motor 122 and the power transmission mechanism 123 as in the case of the head recovery device 126, thus making it possible for the blade to engage with the discharge port surface of the IJC 120. In this way, at an appropriate timing in operating a recording by the IJC 120 or after a discharge recovery process by use of the head recovery device, the blade 130 is caused to protrude into the traveling path of the IJC 120, and along with the traveling operation of the IJC 120, the dew condensation, wetting, dust particles, or the like adhering to the discharge port surface of the IJC 120 is wiped off.

Here, for the embodiment described above, the description has been made of an ink jet apparatus using a printer having an ink jet recording head mounted on a carriage. However, the present invention is suitably applicable to an information processing apparatus provided with a scanner unit having substantially the same external appearance as the ink jet recording head, which is mountable on the carriage compatibly with the ink jet recording head in order to read image information from a source document supported by the platen.

Also, besides usual ink that contains coloring materials, "ink" referred to in the present invention includes a processing liquid, which does not contain any coloring materials, but which is used for the enhancement of the fixation of ordinary ink, for example.

What is claimed is:

1. An ink jet head having heaters to generate energy to be utilized for discharging ink, and MOS transistors to supply electric power to said heaters for recording by discharging ink, said MOS transistors comprising:

source regions and drain regions formed by doping layers arranged near a surface of a semiconductor substrate;

gates formed on said semiconductor substrate through an oxide film and arranged to cross over said source regions and said drain regions; and contact units formed by a doping layer different from that of said source regions, and arranged near the surface of the substrate at and within said source regions in order to draw out electrons or holes to be unintentionally generated on said semiconductor substrate.

2. An ink jet head according to claim 1, wherein said source regions and said contact units are connected to a same potential.

3. An ink jet head according to claim 1, wherein said heaters and said MOS transistors are arranged on a common substrate.

4. A head according to claim 3, wherein a plurality of unit segments each having said source region, said drain region, and said gate are arranged adjacent to each other, and said source region is located at a region where said unit segments are adjacent to each other.

5. A head according to claim 4, wherein said unit segments that are adjacent to each other use said source region in common.

6. A head according to claim 1, wherein a plurality of unit segments each having said source region, said drain region, and said gate are arranged adjacent to each other, and said source region is located at a region where said unit segments are adjacent to each other.

7. A head according to claim 6, wherein said unit segments that are adjacent to each other use said source region in common.

8. A substrate for use with an ink jet head having heaters to generate energy to be utilized for discharging ink, and MOS transistors to supply electric power to the heaters for recording by discharging ink, said MOS transistors comprising:

source regions and drain regions formed by doping layers arranged near a surface of a semiconductor substrate;

gates formed on said semiconductor substrate through an oxide film and arranged to cross over said source regions and said drain regions; and contact units formed by a doping layer different from that of said source regions, and arranged near the surface of the substrate at and within said source regions in order to draw out electrons or holes to be unintentionally generated on said semiconductor substrate.

9. An ink jet cartridge formed by an ink jet head having heaters to generate energy to be utilized for discharging ink, and MOS transistors to supply electric power to the heaters for recording by discharging ink, and also, by an ink retainer to retain ink to be supplied to the head, said MOS transistors comprising:

source regions and drain regions formed by doping layers arranged near a surface of a semiconductor substrate;

gates formed on said semiconductor substrate through an oxide film and arranged to cross over said source regions and said drain regions; and contact units formed by a doping layer different from that of the source regions, and arranged near the surface of the substrate at and within the source regions in order to draw out electrons or holes to be unintentionally generated on said semiconductor substrate.

10. An ink jet apparatus provided with an ink jet head having heaters to generate energy to be utilized for discharging ink, and MOS transistors to supply electric power to the heaters for recording by discharging ink, and also, with a mounting unit to mount the head, said MOS transistors comprising:

source regions and drain regions formed by doping layers arranged near a surface of a semiconductor substrate;

gates formed on said semiconductor substrate through an oxide film and arranged to cross over said source regions and the drain regions; and contact units formed by a doping layer different from that of the source regions, and arranged near the surface of the substrate at and within the source regions in order to draw out electrons or holes to be unintentionally generated on said semiconductor substrate.

11. An ink jet recording head according to claim 1, wherein said source regions and said contact units contact each other.

12. An ink jet recording head according to claim 1, wherein said source regions, said drain regions and said gates extend in a direction apart from said heaters.

13. An ink jet recording head according to claim 12, wherein a plurality of said contact units are provided at and within one of said source regions so that said contact units are separated from each other along said direction.

* * * * *

UNITED STATES PATENT AND TRADEMARK OFFICE

CERTIFICATE OF CORRECTION

PATENT NO. : 6,267,470 B1
DATED : July 31, 2001
INVENTOR(S) : Hidenori Watanabe

It is certified that error appears in the above-identified patent and that said Letters Patent is hereby corrected as shown below:

Title page,
Item [56], References Cited, FOREIGN PATENT DOCUMENTS,

"6302363" should read -- 63-23363 --; and
"1235369" should read -- 1-235369 --.

Column 2,
Line 58, "thorough" should read -- through --; and
Line 64, "E; the" should read -- E, the --.

Column 8,
Line 51, "124; 116," should read -- 124. 116, --;
Line 52, "120, which is" should read -- 120, is --; and
Line 54, "which" should be deleted.

Signed and Sealed this

Nineteenth Day of March, 2002

*Attest:*

JAMES E. ROGAN

*Attesting Officer*

*Director of the United States Patent and Trademark Office*